(12) United States Patent
Qu et al.

(10) Patent No.: US 7,403,056 B2
(45) Date of Patent: Jul. 22, 2008

(54) DELAY APPARATUS AND METHOD THEREOF

(75) Inventors: Jingran Qu, Beijing (CN); Zhongding Liu, Beijing (CN); Chun-Fu Lin, Milpitas, CA (US)

(73) Assignee: Via Technologies, Inc., Hsin-Tien, Taipei (TW)

( * ) Notice: Subject to any disclaimer, the term of this patent is extended or adjusted under 35 U.S.C. 154(b) by 0 days.

(21) Appl. No.: 11/562,473

(22) Filed: Nov. 22, 2006

(65) Prior Publication Data

US 2008/0116948 A1    May 22, 2008

(51) Int. Cl.
*H03H 11/26* (2006.01)
(52) U.S. Cl. .................. 327/269; 327/270; 327/276; 327/277; 327/158; 327/161
(58) Field of Classification Search .............. None
See application file for complete search history.

(56) References Cited

U.S. PATENT DOCUMENTS 5,451,894 A * 9/1995 Guo ........................ 327/241
6,259,294 B1 * 7/2001 Murakami et al. .......... 327/277
6,424,193 B1 * 7/2002 Hwang ..................... 327/158
6,791,384 B2 * 9/2004 Iwashita .................... 327/158
7,154,324 B1 * 12/2006 Maangat et al. ............ 327/288

* cited by examiner

*Primary Examiner*—N. Drew Richards
*Assistant Examiner*—An T. Luu
(74) *Attorney, Agent, or Firm*—Thomas, Kayden, Horstemeyer & Risley

(57) ABSTRACT

The present invention provides a delay apparatus for delaying an input signal by a predetermined delay amount, including: a plurality of delay units for respectively delaying the input signal by the predetermined delay amount, each delay unit having a plurality of delay cells for respectively delaying the input signal by a certain delay period; and a sub decoding unit for generating a plurality of sub control signals to each of the delay units according to a first control signal and a selecting signal, wherein only delay cell of all the delay units is outputted at a time according to the sub controls signals.

19 Claims, 9 Drawing Sheets

| VAL | CS1 | SEL | VAL | CS1 | SEL | VAL | CS1 | SEL | VAL | CS1 | SEL |
|---|---|---|---|---|---|---|---|---|---|---|---|
| 1 | 00000001 | 0001 | 34 | 10000000 | 0010 | 67 | 00000001 | 0100 | 100 | 10000000 | 1000 |
| 2 | 00000001 | 0001 | 35 | 10000000 | 0010 | 68 | 00000001 | 0100 | 101 | 01000000 | 1000 |
| 3 | 00000001 | 0001 | 36 | 10000000 | 0010 | 69 | 00000010 | 0100 | 102 | 01000000 | 1000 |
| 4 | 00000001 | 0001 | 37 | 01000000 | 0010 | 70 | 00000010 | 0100 | 103 | 01000000 | 1000 |
| 5 | 00000010 | 0001 | 38 | 01000000 | 0010 | 71 | 00000010 | 0100 | 104 | 01000000 | 1000 |
| 6 | 00000010 | 0001 | 39 | 01000000 | 0010 | 72 | 00000010 | 0100 | 105 | 00100000 | 1000 |
| 7 | 00000010 | 0001 | 40 | 01000000 | 0010 | 73 | 00000100 | 0100 | 106 | 00100000 | 1000 |
| 8 | 00000010 | 0001 | 41 | 00100000 | 0010 | 74 | 00000100 | 0100 | 107 | 00100000 | 1000 |
| 9 | 00000100 | 0001 | 42 | 00100000 | 0010 | 75 | 00000100 | 0100 | 108 | 00100000 | 1000 |
| 10 | 00000100 | 0001 | 43 | 00100000 | 0010 | 76 | 00000100 | 0100 | 109 | 00010000 | 1000 |
| 11 | 00000100 | 0001 | 44 | 00100000 | 0010 | 77 | 00001000 | 0100 | 110 | 00010000 | 1000 |
| 12 | 00000100 | 0001 | 45 | 00010000 | 0010 | 78 | 00001000 | 0100 | 111 | 00010000 | 1000 |
| 13 | 00001000 | 0001 | 46 | 00010000 | 0010 | 79 | 00001000 | 0100 | 112 | 00010000 | 1000 |
| 14 | 00001000 | 0001 | 47 | 00010000 | 0010 | 80 | 00001000 | 0100 | 113 | 00001000 | 1000 |
| 15 | 00001000 | 0001 | 48 | 00010000 | 0010 | 81 | 00010000 | 0100 | 114 | 00001000 | 1000 |
| 16 | 00001000 | 0001 | 49 | 00001000 | 0010 | 82 | 00010000 | 0100 | 115 | 00001000 | 1000 |
| 17 | 00010000 | 0001 | 50 | 00001000 | 0010 | 83 | 00010000 | 0100 | 116 | 00001000 | 1000 |
| 18 | 00010000 | 0001 | 51 | 00001000 | 0010 | 84 | 00010000 | 0100 | 117 | 00000100 | 1000 |
| 19 | 00010000 | 0001 | 52 | 00001000 | 0010 | 85 | 00100000 | 0100 | 118 | 00000100 | 1000 |
| 20 | 00010000 | 0001 | 53 | 00000100 | 0010 | 86 | 00100000 | 0100 | 119 | 00000100 | 1000 |
| 21 | 00100000 | 0001 | 54 | 00000100 | 0010 | 87 | 00100000 | 0100 | 120 | 00000100 | 1000 |
| 22 | 00100000 | 0001 | 55 | 00000100 | 0010 | 88 | 00100000 | 0100 | 121 | 00000010 | 1000 |
| 23 | 00100000 | 0001 | 56 | 00000100 | 0010 | 89 | 01000000 | 0100 | 122 | 00000010 | 1000 |
| 24 | 00100000 | 0001 | 57 | 00000010 | 0010 | 90 | 01000000 | 0100 | 123 | 00000010 | 1000 |
| 25 | 01000000 | 0001 | 58 | 00000010 | 0010 | 91 | 01000000 | 0100 | 124 | 00000010 | 1000 |
| 26 | 01000000 | 0001 | 59 | 00000010 | 0010 | 92 | 01000000 | 0100 | 125 | 00000001 | 1000 |
| 27 | 01000000 | 0001 | 60 | 00000010 | 0010 | 93 | 10000000 | 0100 | 126 | 00000001 | 1000 |
| 28 | 01000000 | 0001 | 61 | 00000001 | 0010 | 94 | 10000000 | 0100 | 127 | 00000001 | 1000 |
| 29 | 10000000 | 0001 | 62 | 00000001 | 0010 | 95 | 10000000 | 0100 | 128 | 00000001 | 1000 |
| 30 | 10000000 | 0001 | 63 | 00000001 | 0010 | 96 | 10000000 | 0100 | | | |
| 31 | 10000000 | 0001 | 64 | 00000001 | 0010 | 97 | 10000000 | 1000 | | | |
| 32 | 10000000 | 0001 | 65 | 00000001 | 0100 | 98 | 10000000 | 1000 | | | |
| 33 | 10000000 | 0010 | 66 | 00000001 | 0100 | 99 | 10000000 | 1000 | | | |

Fig.5

| VAL | SCS$_1$[b$_7$b$_6$b$_5$b$_4$b$_3$b$_2$b$_1$b$_0$] | SCS$_2$[b$_7$b$_6$b$_5$b$_4$b$_3$b$_2$b$_1$b$_0$] | SCS$_3$[b$_7$b$_6$b$_5$b$_4$b$_3$b$_2$b$_1$b$_0$] | SCS$_4$[b$_7$b$_6$b$_5$b$_4$b$_3$b$_2$b$_1$b$_0$] | Turned on pass gate |
|---|---|---|---|---|---|
| 1~4 | 0000000"1" | 00000000 | 00000000 | 00000000 | PSG$_{10}$ |
| 5~8 | 000000"1"0 | 00000000 | 00000000 | 00000000 | PSG$_{11}$ |
| 9~12 | 00000"1"00 | 00000000 | 00000000 | 00000000 | PSG$_{12}$ |
| 13~16 | 0000"1"000 | 00000000 | 00000000 | 00000000 | PSG$_{13}$ |
| 17~20 | 000"1"0000 | 00000000 | 00000000 | 00000000 | PSG$_{14}$ |
| 21~24 | 00"1"00000 | 00000000 | 00000000 | 00000000 | PSG$_{15}$ |
| 25~28 | 0"1"000000 | 00000000 | 00000000 | 00000000 | PSG$_{16}$ |
| 29~31 | "1"0000000 | 00000000 | 00000000 | 00000000 | PSG$_{17}$ |
| 32 | "1"0000000 | 00000000 | 00000000 | 00000000 | PSG$_{17}$ |
| 33~36 | 00000000 | "1"0000000 | 00000000 | 00000000 | PSG$_{20}$ |
| 37~40 | 00000000 | 0"1"000000 | 00000000 | 00000000 | PSG$_{21}$ |
| 41~44 | 00000000 | 00"1"00000 | 00000000 | 00000000 | PSG$_{22}$ |
| 45~48 | 00000000 | 000"1"0000 | 00000000 | 00000000 | PSG$_{23}$ |
| 49~52 | 00000000 | 0000"1"000 | 00000000 | 00000000 | PSG$_{24}$ |
| 53~56 | 00000000 | 00000"1"00 | 00000000 | 00000000 | PSG$_{25}$ |
| 57~60 | 00000000 | 000000"1"0 | 00000000 | 00000000 | PSG$_{26}$ |
| 61~63 | 00000000 | 0000000"1" | 00000000 | 00000000 | PSG$_{27}$ |
| 64 | 00000000 | 0000000"1" | 00000000 | 00000000 | PSG$_{27}$ |
| 65~68 | 00000000 | 00000000 | 0000000"1" | 00000000 | PSG$_{30}$ |
| 69~72 | 00000000 | 00000000 | 000000"1"0 | 00000000 | PSG$_{31}$ |
| 73~76 | 00000000 | 00000000 | 00000"1"00 | 00000000 | PSG$_{32}$ |
| 77~80 | 00000000 | 00000000 | 0000"1"000 | 00000000 | PSG$_{33}$ |
| 81~84 | 00000000 | 00000000 | 000"1"0000 | 00000000 | PSG$_{34}$ |
| 85~88 | 00000000 | 00000000 | 00"1"00000 | 00000000 | PSG$_{35}$ |
| 89~92 | 00000000 | 00000000 | 0"1"000000 | 00000000 | PSG$_{36}$ |
| 93~95 | 00000000 | 00000000 | "1"0000000 | 00000000 | PSG$_{37}$ |
| 96 | 00000000 | 00000000 | "1"0000000 | 00000000 | PSG$_{37}$ |
| 97~100 | 00000000 | 00000000 | 00000000 | "1"0000000 | PSG$_{40}$ |
| 101~104 | 00000000 | 00000000 | 00000000 | 0"1"000000 | PSG$_{41}$ |
| 105~108 | 00000000 | 00000000 | 00000000 | 00"1"00000 | PSG$_{42}$ |
| 109~112 | 00000000 | 00000000 | 00000000 | 000"1"0000 | PSG$_{43}$ |
| 113~116 | 00000000 | 00000000 | 00000000 | 0000"1"000 | PSG$_{44}$ |
| 117~120 | 00000000 | 00000000 | 00000000 | 00000"1"00 | PSG$_{45}$ |
| 121~124 | 00000000 | 00000000 | 00000000 | 000000"1"0 | PSG$_{46}$ |
| 125~127 | 00000000 | 00000000 | 00000000 | 0000000"1" | PSG$_{47}$ |
| 128 | 00000000 | 00000000 | 00000000 | 0000000"1" | PSG$_{47}$ |

DELAY APPARATUS AND METHOD THEREOF

FIELD OF THE INVENTION

The present invention relates to a delay apparatus and method thereof. Specifically, the present invention relates to a delay apparatus and method thereof used in a delay locked loop circuit.

BACKGROUND OF THE INVENTION

In synchronous electronic systems, the integrated circuits in the system are synchronized to a common reference clock. This synchronization often cannot be achieved simply by distributing a single reference clock to each of the integrated circuits for the following reasons, among others. When an integrated circuit receives a reference clock, the circuit often must condition the reference clock before the circuit can use the clock. Usually, a delay locked loop (DLL) has at least one delay element and a control circuit to provide the time delay as required, so as to synchronize the local clock to the reference clock. For example, as shown in FIG. 1, in a memory interface between a DDR (Double Data Rate) memory and a chipset, a clock cycle of DQS (data strobe) signal and a clock cycle of DQ (data) signal passed from the DDR memory to the chipset should be ideally aligned with each other. In this case, a DLL circuit will be used for phase-shifting the DQS signal by a certain delay for accurately latching the data.

As mentioned above, the DLL circuit is commonly used in integrated circuit, accordingly, there is a need for an improved DLL circuit, which synchronizes input clocks to reference clocks with a linear delay timing performance.

SUMMARY OF THE INVENTION

The present invention provides a delay apparatus for delaying an input signal by a predetermined delay amount. The delay apparatus includes: a plurality of delay cells connected in series for successively delaying the input signal with the predetermined delay amount according to a sub control signal, wherein each delay cell respectively has a delay period; a sub decoding unit coupled to the delay cells for generating the sub control signal according to a first control signal and a selecting signal; and a decoding unit coupled to the sub decoding unit for generating the first control signal and the selecting signal according to a counting value; wherein only one of the delay cell is outputted at a time.

The present invention also provides another delay apparatus for delaying an input signal by a predetermined delay amount. The delay apparatus includes: a decoding circuit for generating a plurality of sub control signals according to a counting value; and a plurality of delay units connected in series for successively delaying the input signal as an output signal, wherein the delay units respectively delays the input signal for the predetermined delay amount according to one of the sub control signal; wherein only one of the sub control signals is valid and only one bit of the valid sub control signal is enabled at a time.

The present invention provides a method for delaying an input signal as an output signal with a predetermined delay amount. The method includes: delaying the input signal successively through a plurality of delay units connected in series; generating a plurality of sub control signals according to a first control signal and a selecting signal, the sub control signals are respectively applied to the corresponding delay unit, wherein the output of each delay unit is respectively determined by the corresponding sub control signal; and determining the output signal from each output of the delay units according to the selecting signal; wherein only one of the sub control signal is valid and only one bit of the valid sub control signal is enabled at a time.

The above and other objects, features and advantages of the present invention will become more readily apparent to those skilled in the art from the following detailed description of preferred embodiments of the present invention taken in conjunction with the accompanying drawings.

BRIEF DESCRIPTION OF THE DRAWINGS

FIG. 5 is an exemplary truth table of FIG. 3;

FIG. 8 is an exemplary truth table of FIG. 6

DETAILED DESCRIPTION OF THE PREFERRED EMBODIMENTS

Figure 1:
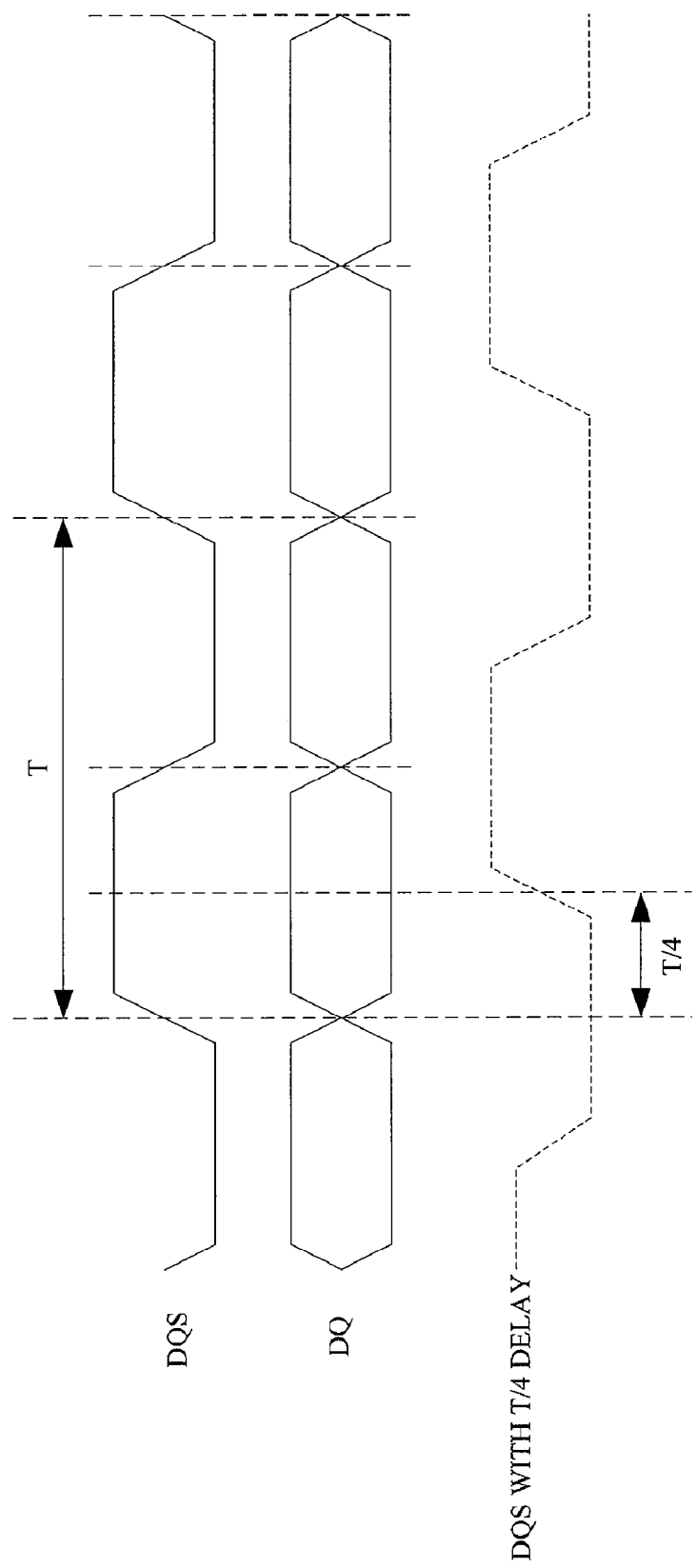
FIG. 1 is a timing chart showing one example of the timing of a DQS signal and a DQ signal.
Figure 2:
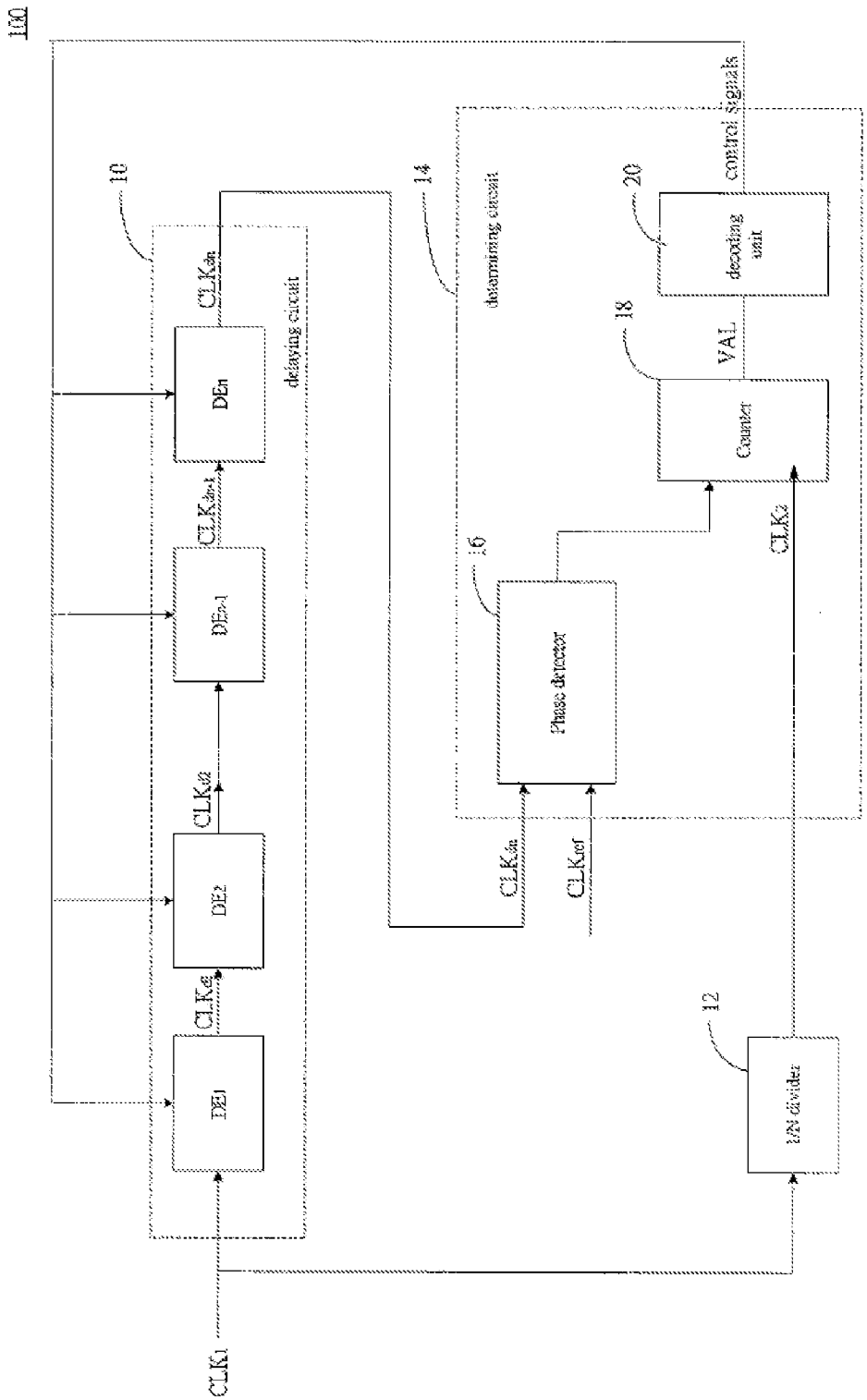
FIG. 2 is a block diagram of a delay locked loop circuit.

FIG. 2 is a block diagram showing a conventional delay locked loop (DLL) circuit for providing a required phase difference. Referring to FIG. 2, the delay locked loop circuit 100 includes: a delaying circuit 10 having a plurality of delay elements $DE_1 \sim DE_n$ with a certain delay period connected in series for successively delaying the input signal $CLK_1$ as an output signal CLKdn; a 1/N frequency divider 12 for dividing the input signal $CLK_1$ by N, where N is an integer larger than 1; and a determining circuit 14 connected to the 1/N frequency divider 12 and the delay circuit 10 for generating a control signal to control the delay amount of the delay circuit 10. The determining circuit 14 includes a phase detector 16; a counter 18 (ex. an up/down gray code counter), and a decoding unit 20. The phase detector 16 determines the phase difference between a reference clock REFCLK and the output signal CLKdn; and the counter 18 counts the phase difference according to a counting clock $CLK_2$ from the 1/N divider 12 and output a counting value VAL. The counting value VAL could be in the format of a gray code. The decoding unit 20 generates the control signals according to the counting value VAL and a table. The control signals are applied to the delay circuit 10 for adjusting the delay amounts of the delay circuit 10.

Figure 3:
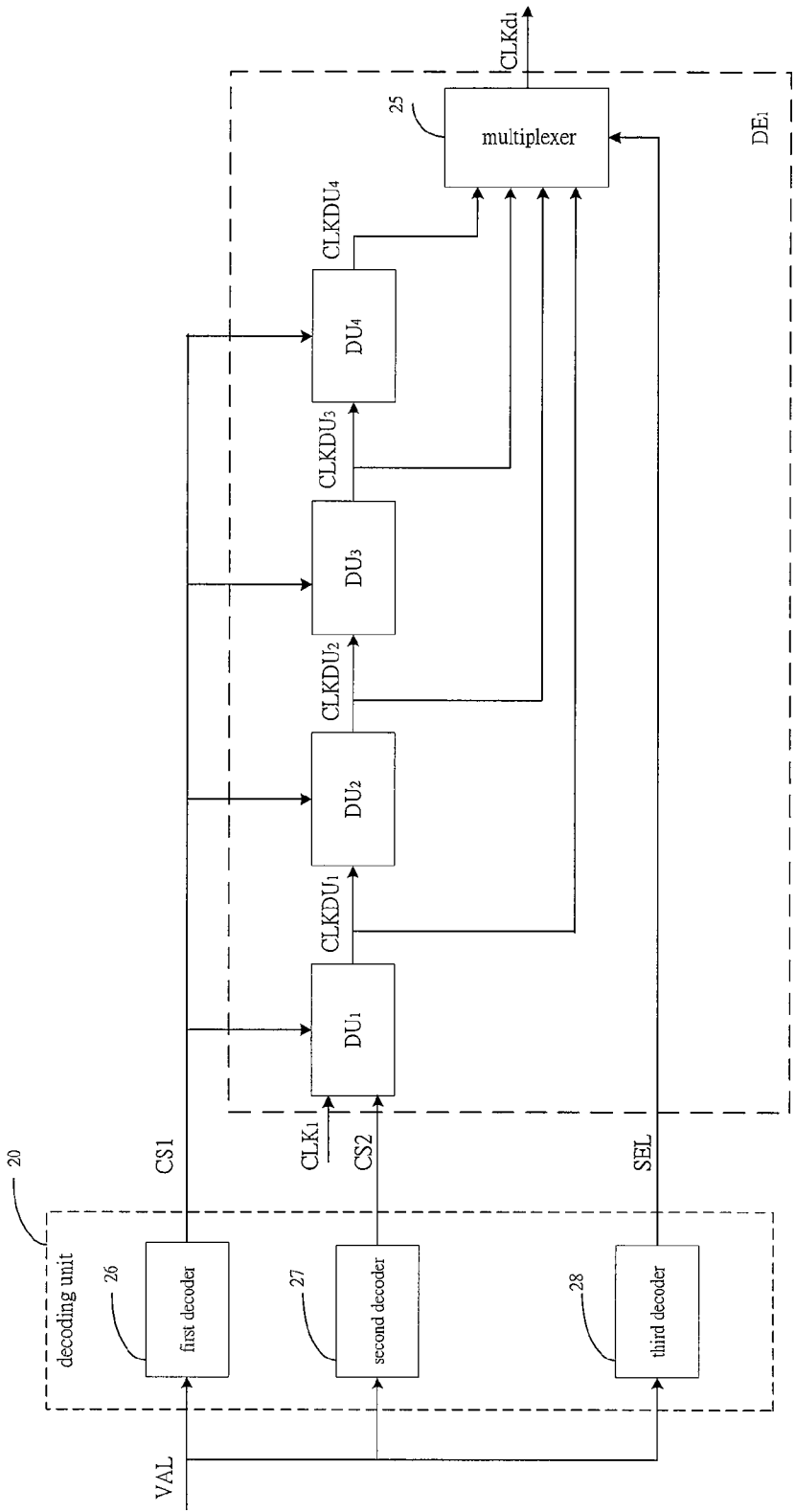
FIG. 3 is a first block diagram of a delay element of the present invention.

The delay circuit 10 as shown in FIG. 2 has at least one delay element, and each delay element has a plurality of delay units for respectively delaying the clock signal $CLK_1$ for a certain delay amounts according to VAL. Take the first delay element $DE_1$ of FIG. 2 as an example and as shown in FIG. 3. In the present invention, assume the delay element $DE_1$ includes four delay units $DU_1 \sim DU_4$ and a multiplexer 25; and the decoding unit 20 includes: a first decoder 26, a second decoder 27 and a third decoder 28. The first decoder 26 generates a first control signal CS1 to each delay units $DU_1$~$DU_4$ for respectively controlling the delay amount of delay units $DU_1$~$DU_4$. The second decoder 27 generates a second control signal CS2 to the first delay unit $DU_1$ to fine tune the delay amount of the input signal $CLK_1$. The third decoder 28 generates a selecting signal SEL to the multiplexer 25 for determining the output signal $CLKd1$ of the first delay element $DE_1$ from the four delay units $DU_1$~$DU_4$.

Figure 4A:
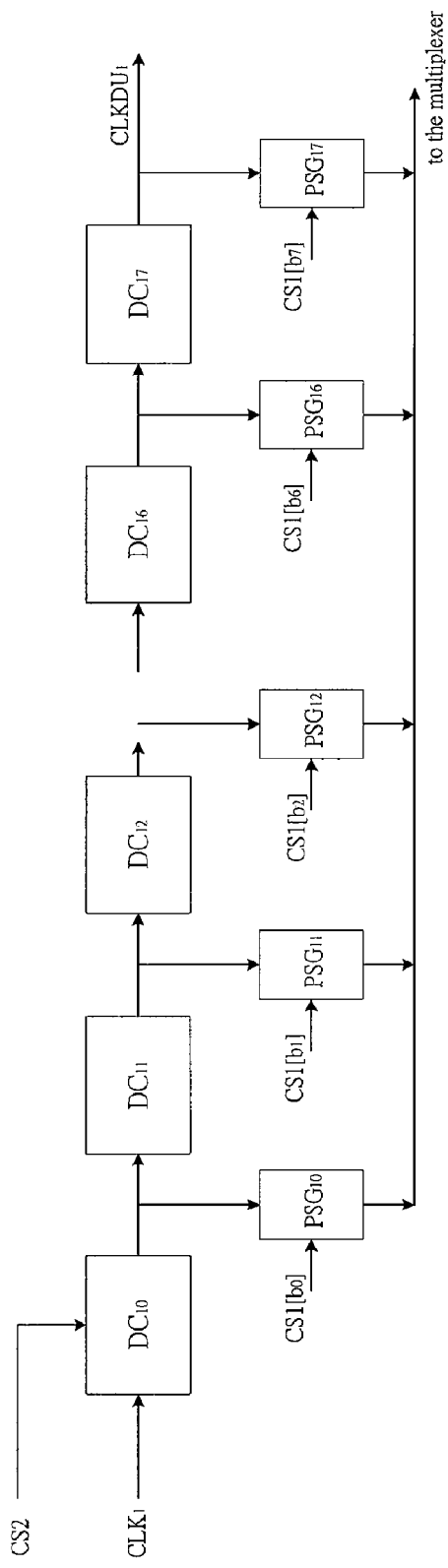
FIG. 4a is an exemplary schematic of a first delay unit in FIG. 3.

FIG. 4a shows an exemplary schematic of the first delay unit $DU_1$ in the FIG. 3. The first delay unit $DU_1$ includes: eight successively connected delay cells $DC_{10}$~$DC_{17}$ for successively delaying the input signal $CLK_1$; and eight pass gates $PSG_{10}$~$PSG_{17}$ respectively connected to the output of each delay cells $DC_{10}$~$DC_{17}$ and controlled by the first control signal CS1. The first delay cell (i.e. fine delay cell) $DC_{10}$ of the first delay unit $DU_1$ is used to fine tune the input signal $CLK_1$ according to the second control signal CS2 from the second decoder 27; and the others delay cell $DC_{11}$~$DC_{17}$ respectively receive the signal from the previously connected delay cell and output to the next connected delay cell. The pass gates $PSG_{10}$~$PSG_{17}$ are respectively connected to the corresponding output of the delay cells $DC_{10}$~$DC_{17}$ and controlled by one corresponding bit of the first control signal CS1. That is, assume the first control signal CS1 has 8 bits ($b_0$, $b_1$, ... $b_7$), and each bit is corresponding to one of the pass gates $PSG_{10}$~$PSG_{17}$. For example, the second pass gate $PSG_{11}$ controlled by $b_1$ is connected to the output of the second delay cell $DC_{11}$. When $b_1$ is enabled (i.e. logic 1), the second pass gate $PSG_{11}$ is turned on, and the output of the second delay cell $DC_{11}$ is thus outputted as the output signal $CLKDU_1$ of the first delay unit $DU_1$.

In the present invention, only one bit of the first control signal CS1 from the first decoder 26 is enabled (i.e. logic 1) at a time. When a certain bit of the first control signal CS1 is enabled, the corresponding pass gate is turned on and the connected delay cell is thus outputted as the output signal $CLKDU_1$ of the first delay unit $DU_1$.

Figure 4B:
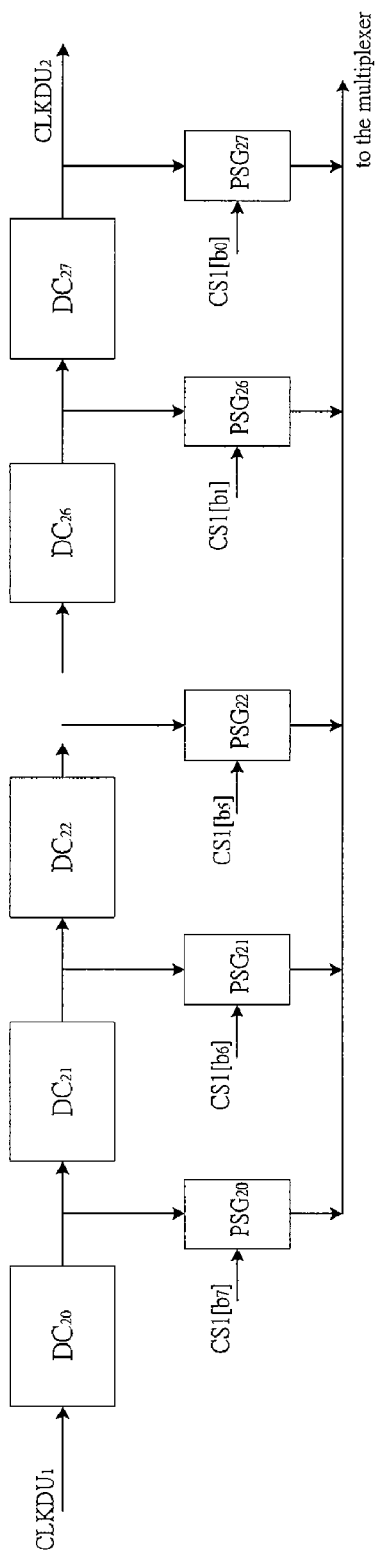
FIG. 4b is an exemplary schematic of a second delay unit in the FIG. 3.

FIG. 4b shows an exemplary schematic of the second delay unit $DU_2$ in the FIG. 3. The second delay unit $DU_2$ includes: eight successively connected delay cells $DC_{20}$~$DC_{27}$ for successively delaying the signal $CLKDU_1$ outputted from the first delay unit $DU_1$; and eight pass gates $PSG_{20}$~$PSG_{27}$ respectively connected to the output of each delay cells $DC_{20}$~$DC_{27}$ and controlled by the first control signal CS1. The connections of the delay cells $DC_{20}$~$DC_{27}$ and the pass gates $PSG_{20}$~$PSG_{27}$ of the second delay unit $DU_2$ are similar as the first delay unit $DU_1$; for example, the first pass gate $PSG_{20}$ is connected to the first delay cell $DC_{20}$. Furthermore, the first delay cell $DC_{20}$ of the second delay unit $DU_2$ is connected to the last delay cell (i.e. $DC_{17}$) of the first delay unit $DU_1$. However, it's noticed that the first pass gates $PSG_{20}$ connected to the first delay cell $DC_{20}$ is controlled by the MSB (i.e. $b_7$) of the first control signal CS1, and the eighth pass gates $PSG_{27}$ connected to the eighth delay cell $DC_{27}$ is controlled by the LSB (i.e. $b_0$) of the first control signal CS1. Assume that if $b_7$ is enabled (i.e. logic 1), the first pass gate $PSG_{20}$ is turned on, and the output of the first delay cell $DC_{20}$ is thus outputted as the output signal $CLKDU_2$ of the second delay unit $DU_2$.

The third delay unit $DU_3$ and the fourth delay unit $DU_4$ have the same schematics as shown in FIG. 4b. The first delay cell $DC_{30}$ of the third delay unit $DU_3$ is connected to the last delay cell (i.e. $DC_{27}$) of the second delay unit $DU_2$; and the first delay cell $DC_{40}$ of the fourth delay unit $DU_4$ is connected to the last delay cell (i.e. $DC_{37}$) of the third delay unit $DU_3$.

It's also noticed that, in the third the delay unit $DU_3$, the first pass gates $PSG_{30}$ connected to the first delay cell $DC_{30}$ is controlled by the LSB (i.e. $b_0$) of the first control signal CS1, and the eighth pass gates $PSG_{37}$ connected to the eighth delay cell $DC_{37}$ is controlled by the MSB (i.e. $b_7$) of the first control signal CS1. In the fourth delay unit $DU_4$, the first pass gates $PSG_{40}$ connected to the first delay cell $DC_{40}$ is controlled by the MSB (i.e. $b_7$) of the first control signal CS1, and the eighth pass gates $PSG_{47}$ connected to the eighth delay cell $DC_{47}$ is controlled by the LSB (i.e. $b_0$) of the first control signal CS1. For example, when $b_7$ of the first control signal CS1 is enabled (i.e. logic 1), the pass gate $PSG_{37}$ and $PSG_{40}$ are turned on, and the delay cell $DC_{37}$ and $DC_{40}$ are respectively outputted as the output signal $CLKDU_3$ and $CLKDU_4$ of the third delay unit $DU_3$ and the fourth delay unit $DU_4$.

As the description above, the delay unit $DU_1$~$DU_4$ are all controlled by the first control signal CS1; therefore the output signal $CLKDU_1$~$CLKDU_4$ of the delay unit $DU_1$~$DU_4$ are outputted at a time. FIG. 5 is one exemplary truth table of the embodiment, and Table I shows the relationships between the first control signal CS1 and the accordingly turned on pass gates.

| CS1 [$b_7 b_6 b_5 b_4 b_3 b_2 b_1 b_0$] | The corresponding turned on pass gates |
|---|---|
| (000 000 01) | $PSG_{10}$, $PSG_{27}$, $PSG_{30}$, $PSG_{47}$ |
| (000 000 10) | $PSG_{11}$, $PSG_{26}$, $PSG_{31}$, $PSG_{46}$ |
| (000 001 00) | $PSG_{12}$, $PSG_{25}$, $PSG_{32}$, $PSG_{45}$ |
| (000 010 00) | $PSG_{13}$, $PSG_{24}$, $PSG_{33}$, $PSG_{44}$ |
| (000 100 00) | $PSG_{14}$, $PSG_{23}$, $PSG_{34}$, $PSG_{43}$ |
| (001 000 00) | $PSG_{15}$, $PSG_{22}$, $PSG_{35}$, $PSG_{42}$ |
| (010 000 00) | $PSG_{16}$, $PSG_{21}$, $PSG_{36}$, $PSG_{41}$ |
| (100 000 00) | $PSG_{17}$, $PSG_{20}$, $PSG_{37}$, $PSG_{40}$ |
| (100 000 00) | $PSG_{17}$, $PSG_{20}$, $PSG_{37}$, $PSG_{40}$ |
| ... | ... |

In the embodiment, the first delay cell $DC_{10}$ of the first delay unit $DU_1$ is used to fine tune the input signal $CLK_1$. The first delay cell $DC_{10}$ has 4 fine tune steps and the delay period of each step is t1. Moreover, the other delay cell $DC_{11}$~$DC_{17}$, $DC_{20}$~$DC_{27}$, $DC_{30}$~$DC_{37}$, $DC_{40}$~$DC_{47}$, respectively have the delay period of t2 which is substantially equals to 4*t1. That is to say, the first delay unit $DU_1$ has the delay periods from 1*t1 to 32*t1; the second delay unit $DU_2$ has the delay periods from 33*t1 to 64*t1; the third delay unit $DU_3$ has the delay periods from 65*t1 to 96*t1; the fourth delay unit $DU_4$ has the delay periods from 97*t1 to 128*t1. Referring to FIG. 4a, FIG. 5 and Table I, if the delay periods of 32*t1 (i.e. the VAL is (00010000)) is required, the corresponding first control signal CS1 is (10000000) and the selecting signal SEL is (0001), the pass gate $PSG_{17}$ is turned on, which means the 32*t1 delay is contributed by the delay cells $DC_{10}$ and $DC_{17}$ (i.e. 4*t1+7*t2=32*t1). However, if the delay periods of 33*t1 (i.e. the VAL is (00110000)) is required, the corresponding first control signal CS1 is (10000000) and the selecting signal SEL is (0010), the pass gate $PSG_{20}$ is turned on, which means the 33*t1 delay is contributed by the delay cells $DC_{10}$ and $DC_{20}$. (i.e. 1*t1+8*t2=33*t1). It can be seen that when the delay period of 32*t1 is required, the pass gate $PSG_{17}$ behind the delay cell $DC_{10}$ is turned on, however, when the delay period of 33*t1 is required, the pass gate $PSG_{17}$ ahead the delay cell $DC_{20}$ and the pass gate $PSG_{20}$ behind the delay cell $DC_{20}$ are turned on at a same time, therefore, loading of the delay element is unbalanced while the delay period is increased from 32*t1 to 33*t1. As the descriptions above, it's observed that when the delay period is increased from 32*t1 to 32*t1, from 64*t1 to 65*t1 and 96*t1 to 97*t1, the pass gates adjacent to the outputted delay cells are turned on at a same time which leads to unbalanced loading and results in the nonlinearly delay in such embodiment.

Figure 6:
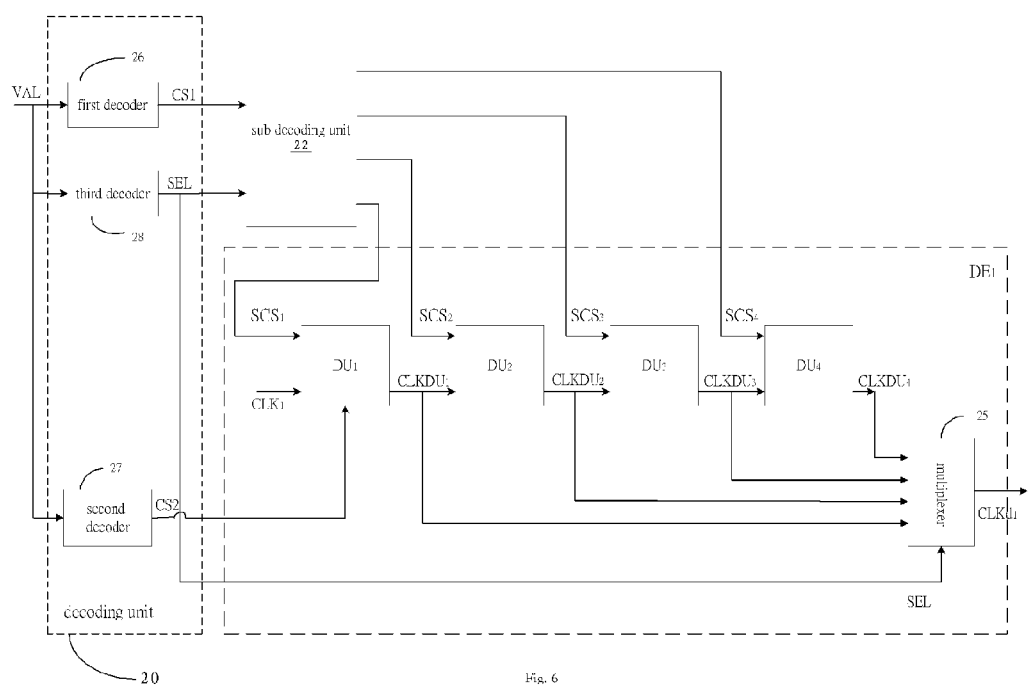
FIG. 6 is a second block diagram of a delay element of the present invention.

Take the first delay element $DE_1$ of FIG. 2 as an example. FIG. 6 shows a schematic of a delay element $DE_1$ according to a second embodiment of the present invention. With comparing to FIG. 3, a sub decoding unit 22 is used for generating a plurality of sub control signals SCS to each of the delay units $DU_1$~$DU_4$ according to the first control signal CS1 and the selecting signal SEL. The decoding unit 20 and the sub decoding unit 22 shown in FIG. 6 could be integrated as a decoding circuit.

Figure 7:
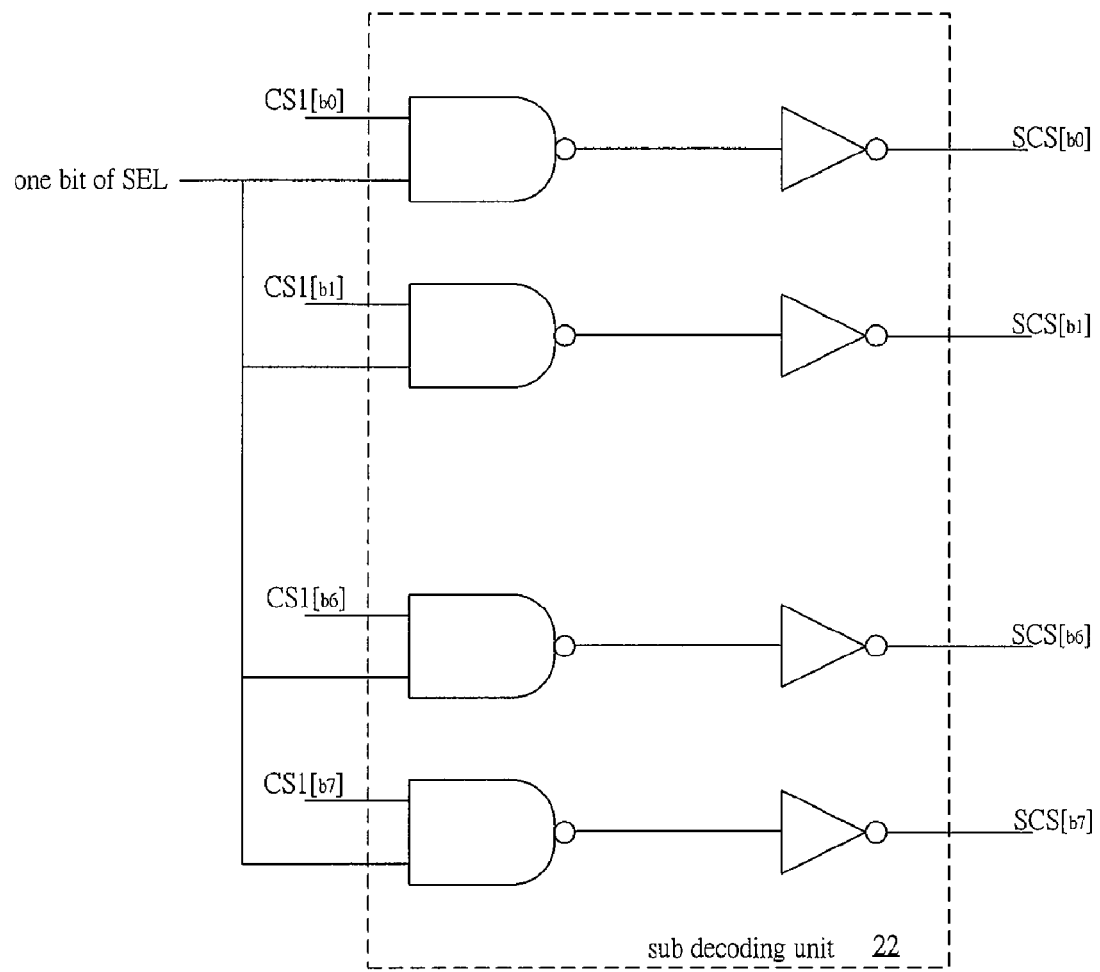
FIG. 7 is an exemplary schematic of sub decoder unit in FIG. 6.

FIG. 7 shows an exemplary schematic of sub decoding unit 22 for generating the sub control signals which includes eight NAND gates and eight inverters; the inverters are respectively connected to the corresponding output of the NAND gate. The NAND gate has two input ports; the first input port respectively receives the corresponding one bit of the first control signal CS1, and the second port receives one bit of the selecting signal SEL. For example, the sub decoding unit 20 generates a first sub control signal $SCS_1$ applied to the first delay unit $DU_1$ according to the first control signal CS1 and the first bit of the selecting signal SEL. In other words, each bit of the first control signal $CS1[b_0 \ldots b_7]$ is respectively applied to the first input port of the corresponding NAND gate; and the first bit of the selecting $SEL[b_0]$ is applied to the second input ports of the NAND gates. Similarly, the sub decoding 610 generates a second sub control signal $SCS_2$ applied to the second delay unit $DU_2$ according to the first control signal CS1 and the second bit of the selecting signal SEL. A third and a fourth sub control signals $SCS_3$ and $SCS_4$ are also respectively generated according to the first control signal CS1 and the third and the fourth bits of the selecting signal SEL. In the embodiment, only one of the sub control signals is valid, and only one bit of the valid sub control signal is enabled; therefore there is only one delay cell of the delay element is outputted. For example, assume the first sub control signal $SCS_1$ is valid, which means one bit of the first sub control signal $SCS_1$ is enabled (i.e. logic "1"); therefore the other sub control signals $SCS_2$~$SCS_4$ are invalid, which means bits of the sub control signals $SCS_2$~$SCS_4$ are set to low (i.e. logic "0").

In general, the sub decoding unit 22 practices the AND logic operations of the first control signal CS1 and the selecting signal SEL.

FIG. 8 shows an exemplary truth table of the second embodiment. It's observed that there is only one of the sub control signals is valid and only one bit of the valid sub control signal is enabled at a time.

Figure 9A:
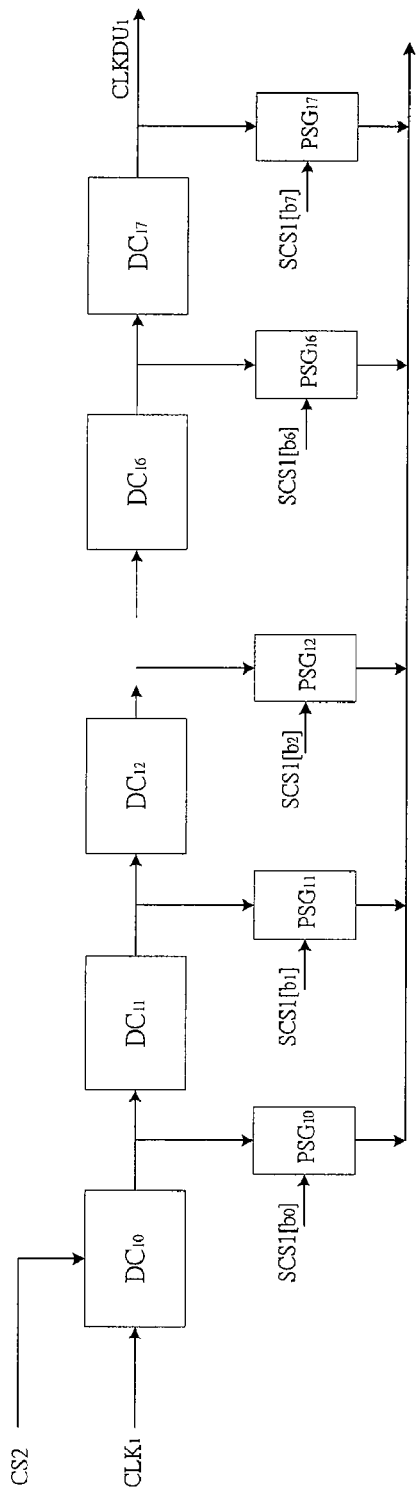
FIG. 9a an exemplary schematic of a first delay unit in FIG. 6.
Figure 9B:
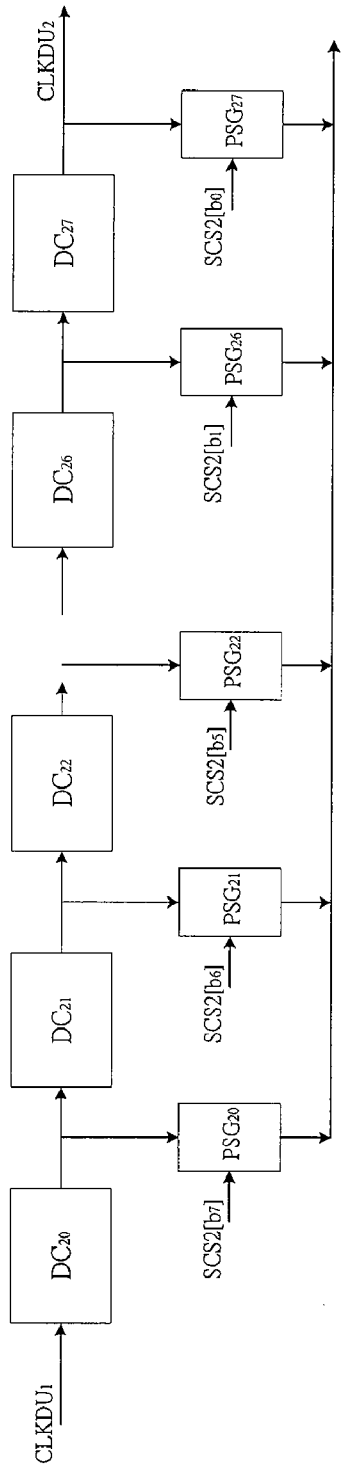
FIG. 9b an exemplary schematic of a second delay unit in FIG. 6.

FIG. 9a and FIG. 9b show the exemplary schematics of the first delay unit $DU_1$ and the second delay unit $DU_2$ in the embodiment which are similar to the diagrams shown in FIG. 4a and FIG. 4b excepting for respectively applying the first sub control signal $SCS_1$ and the second sub control signal $SCS_2$ to the first delay unit $DU_1$ and the second delay unit $DU_2$. The schematics of the third delay unit $DU_3$ and the fourth delay unit $DU_4$ are similarly to the second delay unit $DU_2$ shown in FIG. 9b.

As the described above, in the first delay unit $DU_1$, the first pass gate $PSG_{10}$, connected to the first delay cell $DC_{10}$, is controlled by the LSB (i.e. $SCS_1[b_0]$) of the first sub control signal $SCS_1$; the last pass gate $PSG_{17}$, connected to the last delay cell $DC_{17}$ is controlled by the MSB (i.e. $SCS_1[b_7]$) of the first sub control signal $SCS_1$. In the second delay unit $DU_2$, the first pass gate $PSG_{20}$, connected to the first delay cell $DC_{20}$, is controlled by the MSB (i.e. $SCS_2[b_7]$) of the second sub control signal $SCS_2$; the last pass gate $PSG_{27}$, connected to the last delay cell $DC_{27}$ is controlled by the LSB (i.e. $SCS_2[b_0]$) of the second sub control signal $SCS_2$. In the third delay unit $DU_3$, the first pass gate $PSG_{30}$, connected to the first delay cell $DC_{30}$, is controlled by the LSB (i.e. $SCS_3[b_0]$) of the third sub control signal $SCS_3$; the last pass gate $PSG_{37}$, connected to the last delay cell $DC_{37}$, is controlled by the MSB (i.e. $SCS_3[b_7]$) of the third sub control signal $SCS_3$. In the fourth delay unit $DU_4$, the first pass gate $PSG_{40}$, connected to the first delay cell $DC_{40}$, is controlled by the MSB (i.e. $SCS_4[b_7]$) of the fourth sub control signal $SCS_4$; the last pass gate $PSG_{47}$, connected to the last delay cell $DC_{47}$, is controlled by the LSB (i.e. $SCS_4[b_0]$) of the fourth sub control signal $SCS_4$.

Referring to FIG. 9a and FIG. 9b, assume that if the delay periods of 31*t1 is required, the corresponding first sub control signal $SCS_1$ is (10000000) and the other sub control signals $SCS_2$ $SCS_4$ are (00000000); therefore the pass gate $PSG_{17}$ is turned on, and the 31*t1 delay is contributed by the delay cells $DC_{10}$ and $DC_{17}$ (i.e. 3*t1+7*t2=31*t1). If the delay periods of As the descriptions above, it's observed that both of the time interval from 31*t1 to 32*t1 and from 32*t1 to 33*t1 are t1; similarly, the time intervals between 64*t1 to 65*t1 and 96*t1 to 97*t1 are also t1; therefore the linearly delay is achieved in the second embodiment. 32*t1 (i.e. the VAL is (00010000)) is required, the corresponding first control signal CS1 is (10000000) and the selecting signal SEL is (0001), the pass gate $PSG_{17}$ is turned on, which means the 32*t1 delay is contributed by the delay cells $DC_{10}$ and $DC_{17}$ (i.e. 4*t1+7*t2=32*t1). However, if the delay periods of 33*t1 (i.e. the VAL is (00011000)) is required, the corresponding first control signal CS1 is (10000000) and the selecting signal SEL is (0010), the pass gate $PSG_{20}$ is turned on, which means the 33*t1 delay is contributed by the delay cells $DC_{10}$ and $DC_{20}$. (i.e. 1*t1+8*t2=33*t1).

In the present invention, the delay unit further includes an auxiliary module (not shown in FIGS. 9a and 9b) connected to the pass gates for determine the output of the delay unit; and a plurality of dummy load cells (not shown in FIGS. 9a and 9b) respectively connected to the output of the delay cell for balance the loading of the delay unit.

It should be emphasized that the above-described embodiments, particularly any prefer embodiments, are merely possible examples of implementations, merely set forth for a clear understanding of the principles of the present invention, many variation and modifications may be made to the above-described embodiments without departing substantially from the principles of the disclosure.

The invention claimed is:

1. A delay apparatus for delaying an input signal with a predetermined delay amount, comprising:

a plurality of delay cells connected in series for successively delaying the input signal with the predetermined delay amount according to a sub control signal provided to each delay cells, wherein each delay cell respectively has a delay period;

a sub decoding unit coupled to the delay cells for generating the sub control signal according to a first control signal and a selecting signal; and a decoding unit coupled to the sub decoding unit for generating the first control signal and the selecting signal according to a counting value;

wherein only one of the delay cell is outputted at a time; and wherein, one of the delay cells is used to fine tune the input signal according to a second control signal generated by the decoding unit according to the counting value.

2. The delay apparatus according to claim 1 wherein only one bit of the sub control signal is enabled at a time.

3. The delay apparatus according to claim 1 wherein the sub control signal is generated according to the logic operation of the first control signal and the selecting signal.

4. The delay apparatus according to claim 1 further comprising a plurality of dummy load cells respectively connected to the outputs of the delay cells for balance the loading of the delay apparatus.

5. The delay apparatus according to claim 1 wherein the sub control signals has a plurality bits, each bit is corresponding to one delay cell.

6. The delay apparatus according to claim 1 further comprising a plurality of pass gates respectively connected to the output of the corresponding delay cell, each pass gate is controlled by the corresponding bit of the sub control signal; wherein the delay cell is outputted while the corresponding pass gate is turned on.

7. The delay apparatus according to claim 6 wherein the pass gate is turned on while the corresponding bit of the sub control signal is enabled.

8. The delay apparatus according to claim 6 further comprising:
an auxiliary module connected to the pass gates for determine the output of the delay cell.

9. A delay apparatus for delaying an input signal as an output signal with a predetermined delay amount, comprising:
a decoding circuit for generating a first control signal and a selecting signal according to a counting value, and further generating a plurality of sub control signals according to the first control signal and the selecting signal; and
a plurality of delay units connected in series for successively delaying the input signal, wherein each of the delay units respectively delays the input signal for the predetermined delay amount according to one of the sub control signals;
wherein only one of the sub control signals is valid and only one bit of the valid sub control signal is enabled at a time.

10. The delay apparatus according to claim 9 each of the delay units comprises a plurality of delay cells connected in series, each delay cell has a delay period and controlled by one bit of the corresponding sub control signal.

11. The delay apparatus according to claim 10 wherein one of the delay cells is used to fine tune the input signal according to a second control signal generated by the decoding circuit according to the counting value.

12. The delay apparatus according to claim 10 wherein while the bit of the sub control signal is enable, the output of the corresponding delay cell is outputted as the output signal of the delay signal.

13. The delay apparatus according to claim 10 wherein the each of the delay units further comprises a plurality of pass gates respectively connected to the output of the corresponding delay cell, each pass gate is controlled by the corresponding bit of the sub control signal; wherein the delay cell is outputted while the corresponding pass gate is turned on.

14. The delay apparatus according to claim 13 wherein the pass gate is turned on while the corresponding bit of the sub control signal is enabled.

15. The delay apparatus according to claim 13 each of the delay units further comprises: an auxiliary module connected to the pass gates for determine the output of the delay unit; and a plurality of dummy load cells respectively connected to the outputs of the delay cells for balance the loading of the delay apparatus.

16. The delay apparatus according to claim 9 wherein the decoding circuit comprises: a decoding unit for generating the first control signal and the selecting signal according to the counting value; and a sub decoding unit for generating the plurality of sub control signals according to the first control signal and the selecting signal.

17. The delay apparatus according to claim 16, wherein one of the sub control signal is generated according to the logic operation of each bit of the first control signal and one corresponding bit of the selecting signal.

18. The delay apparatus according to claim 16 wherein each of the sub decoding units comprises a plurality of NAND gate; and a plurality of inverters respectively connected to the corresponding NAND gate.

19. The delay apparatus according to claim 16 further comprising a multiplexer for selecting one of output of the delay units according to the selecting signal generated by the decoding circuit.

* * * * *